(12) United States Patent
Watanabe et al.

(10) Patent No.: US 8,278,962 B2
(45) Date of Patent: Oct. 2, 2012

(54) TRANSFER CIRCUIT, TRANSMITTER, RECEIVER AND TEST APPARATUS

(75) Inventors: Daisuke Watanabe, Saitama (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 170 days.

(21) Appl. No.: 12/700,703

(22) Filed: Feb. 4, 2010

(65) Prior Publication Data
US 2010/0208780 A1    Aug. 19, 2010

Related U.S. Application Data

(63) Continuation of application No. PCT/JP2008/064758, filed on Aug. 19, 2008.

(30) Foreign Application Priority Data

Sep. 4, 2007  (JP) .................... 2007-229462

(51) Int. Cl.
*G01R 31/02*    (2006.01)
(52) U.S. Cl. .............. 324/762.01; 324/537; 324/762.03
(58) Field of Classification Search ...............................
      324/762.01–762.06, 537
See application file for complete search history.

(56) References Cited

U.S. PATENT DOCUMENTS

| | | | |
|---|---|---|---|
| 5,144,225 A * | 9/1992 | Talbot et al. ............ | 324/73.1 |
| 6,789,224 B2 * | 9/2004 | Miura ............ | 714/744 |
| 6,965,248 B2 * | 11/2005 | Miller .............. | 324/762.02 |
| 7,398,169 B2 * | 7/2008 | Yamaguchi et al. ........ | 702/69 |
| 8,067,943 B2 * | 11/2011 | Habu et al. ............ | 324/537 |
| 8,111,082 B2 * | 2/2012 | Negishi ............ | 324/762.01 |
| 8,115,507 B2 * | 2/2012 | Mizuno ............ | 324/762.01 |
| 8,134,356 B2 * | 3/2012 | Dobberpuhl et al. ...... | 324/76.39 |
| 2004/0100838 A1 | 5/2004 | Tamura et al. | |
| 2005/0232412 A1 | 10/2005 | Ichihara et al. | |
| 2006/0290373 A1 * | 12/2006 | Takamiya et al. .......... | 324/765 |

FOREIGN PATENT DOCUMENTS

| | | |
|---|---|---|
| JP | 10-322143 A | 12/1998 |
| JP | 2004-172980 A | 6/2004 |
| JP | 2005-311411 A | 11/2005 |
| JP | 2007-040849 A | 2/2007 |
| TW | 2005-32227 A | 10/2005 |
| TW | I242322 B | 10/2005 |

OTHER PUBLICATIONS

International Search Report (ISR) issued in PCT/JP2008/064758 (parent application).
Written Opinion (PCT/ISA/237) issued in PCT/JP2008/064758 (parent application).
Taiwanese Office Action dated May 7, 2012, in a counterpart Taiwanese patent application No. 097133627.

* cited by examiner

*Primary Examiner* — Joshua Benitez Rosario
(74) *Attorney, Agent, or Firm* — Chen Yoshimura LLP

(57) ABSTRACT

There is provided a transfer circuit including a transmitter that outputs a transmission signal and a receiver that receives the transmission signal. Here, the receiver supplies to the transmitter a feedback signal for controlling a common level of the transmission signal output from the transmitter, and the transmitter controls the common level of the transmission signal output therefrom, in accordance with the feedback signal received from the receiver. The receiver includes a receiving section that operates in accordance with the transmission signal, a reference level generating section that generates a reference level representing an expected level for the common level of the transmission signal input into the receiving section, and a comparing section that compares the common level of the transmission signal input into the receiving section against the reference level and generates the feedback signal in accordance with a result of the comparison.

19 Claims, 10 Drawing Sheets

TRANSFER CIRCUIT, TRANSMITTER, RECEIVER AND TEST APPARATUS

This is a continuation application of PCT/JP2008/064758 filed on Aug. 19, 2008.

BACKGROUND

1. Technical Field

The present invention relates to a transfer circuit, a transmitter, a receiver and a test apparatus.

2. Related Art

A known test apparatus tests a device under test such as a semiconductor circuit by measuring a signal under measurement that is output from the device under test and judging whether the device under test is acceptable based on the result of the measurement. Such a test apparatus uses a comparator to compare the signal level of the signal under measurement against a predetermined threshold value in order to convert the waveform of the signal under measurement into a binary waveform. The test apparatus then uses a CMOS circuit, which forms the following stage, to measure the binary waveform in order to judge whether the device under test is acceptable.

Required to receive the signal under measurement from the device under test, the comparator used in the test apparatus preferably operates at high speed and allows a wide range of input voltages. Therefore, the IC of the comparator is fabricated by utilizing high-mobility semiconductor fabrication technologies with the use of bipolar junction transistors and compound semiconductors.

On the other hand, the circuit of the following stage after the comparator preferably operates at high speed, is highly integrated, and saves power. Therefore, the circuit of the following stage is fabricated by using CMOS processes. The CMOS circuit of the following stage attains the above-mentioned desirable characteristics through miniaturization and a lower power supply voltage.

As the device under test such as a semiconductor circuit operates at an increasingly high frequency, the interface of the CMOS circuit is required to operate at a data rate of several Gbps to 10 Gbps or higher. To satisfy this requirement, the interface of the CMOS circuit is formed by using a low-voltage differential signal circuit (LVDS), a current mode logic circuit (CML), or the like, and often has cascade-connected transistors of four or more stages. Here, the CMOS circuit, which has a lowered power supply voltage, disadvantageously has design difficulties and lowered input/output levels.

In particular, many ultrahigh-speed interfaces formed by using the CMOS processes that achieve miniaturization of 90 nm or less may correctly operate when the input common-mode voltage ranges from approximately 200 mV to 300 mV. Thus, the voltage of the signal received at the interface of the CMOS circuit may not satisfy the input common-mode voltage due to the offset error of the power supply voltage, the waveform degradation resulting from the loss during the transfer line, and other factors. This drawback will become more serious as CMOS devices become further miniaturized in the future.

To solve this issue, a general transfer circuit may conventionally use the AC coupling scheme. In a transfer circuit employing the AC coupling scheme, a signal to be transferred is encoded by a transmitter and then transferred to a receiver via an AC coupled capacitor. The receiver applies a desired bias to the signal that has passed through the AC coupled capacitor, thereby inputting a signal having an ideal common level (bias level) to the circuit of the following stage.

The following patent document is a related prior art document.

Patent Document 1: Japanese Patent Application Publication No. 10-322143

There are, however, difficulties in utilizing the above-mentioned AC coupling scheme for the transfer circuit between the comparator IC and the CMOS circuit in the test apparatus that is designed to test the device under test such as a semiconductor circuit to transfer signals, for the following reason. In the test apparatus, the signal under measurement is transferred in the state of maintaining timing information therein to the CMOS circuit so that the CMOS circuit can measure the waveform, the logic pattern and the like of the signal under measurement. When the AC coupling scheme is used, however, the timing information of the signal under measurement is lost since the signal under measurement is encoded and then transferred to the CMOS circuit. Furthermore, the signal under measurement output from the device under test may be a DC signal. In such cases, the AC coupling scheme cannot be used to measure the DC signal.

In light of the above, it is desired to realize a transfer circuit for use in a test apparatus and the like that can input into a circuit of the following stage a signal having a predetermined common level without the use of the AC coupling scheme. Here, note that the common level of the signal transferred through the transfer circuit may vary in accordance with the variation in temperature, power supply voltage, and other parameters. Therefore, it is also desired to control the common level so as to satisfy the input common-mode voltage even when the temperature, the power supply voltage and other parameters vary.

SUMMARY

Therefore, it is an object of an aspect of the innovations herein to provide a transfer circuit, a transmitter, a receiver and a test apparatus which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, one exemplary transfer circuit may include a transmitter that outputs a transmission signal and a receiver that receives the transmission signal. Here, the receiver supplies to the transmitter a feedback signal for controlling a common level of the transmission signal output from the transmitter, and the transmitter controls the common level of the transmission signal output therefrom, in accordance with the feedback signal received from the receiver.

According to an aspect related to the innovations herein, one exemplary transmitter may be for use in a transfer circuit that transfers a transmission signal. Here, a common level of the transmission signal output to a receiver in the transfer circuit is controlled in accordance with a feedback signal received from the receiver.

According to an aspect related to the innovations herein, one exemplary receiver may be for use in a transfer circuit that transfers a transmission signal. Here, the receiver supplies, to a transmitter in the transfer circuit, a feedback signal used to control a common level of the transmission signal output from the transmitter.

According to an aspect related to the innovations herein, one exemplary test apparatus for testing a device under test may include a signal generating section that generates a test signal, a transfer circuit that transfers a signal under measurement output from the device under test in response to the test signal, and a judging section that judges whether the device under test is acceptable, based on the signal under measurement transferred by the transfer circuit. Here, the transfer circuit includes a transmitter that receives the signal under measurement from the device under test and outputs the signal under measurement, and a receiver that receives the signal under measurement from the transmitter and inputs the signal under measurement into the judging section. The receiver supplies to the transmitter a feedback signal to control a common level of the signal under measurement to be output from the transmitter, and the transmitter controls the common level of the signal under measurement to be output therefrom in accordance with the feedback signal received from the receiver.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
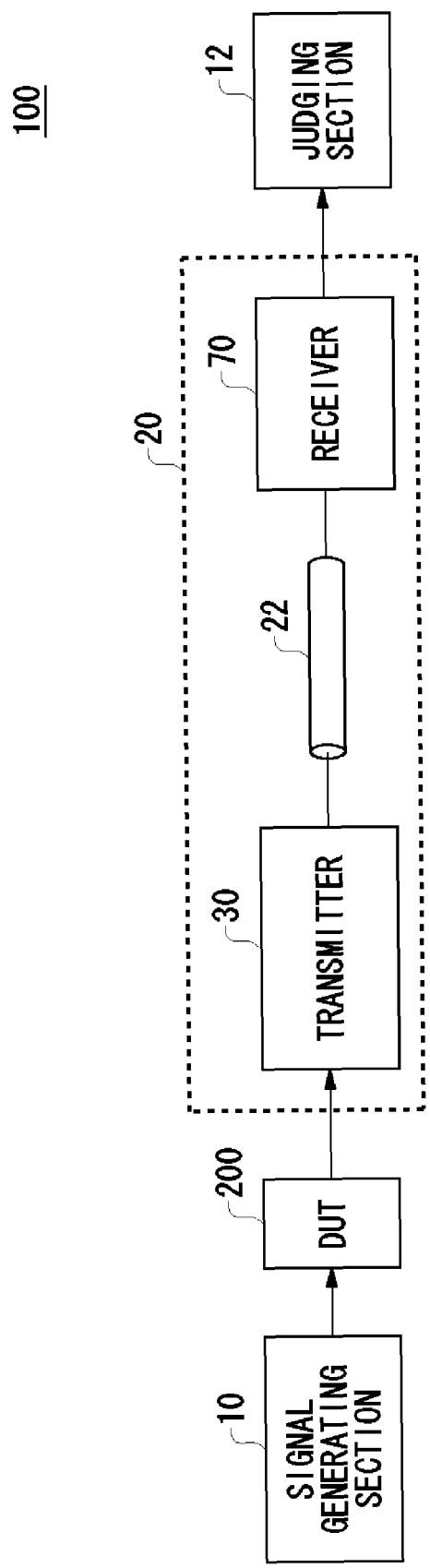
FIG. 1 schematically illustrates the configuration of a test apparatus 100.

FIG. 1 schematically illustrates the configuration of a test apparatus 100. The test apparatus 100 is configured to test a device under test 200 such as a semiconductor circuit. The test apparatus 100 includes a signal generating section 10, a transfer circuit 20, and a judging section 12.

The signal generating section 10 generates a test signal to be input into the device under test 200. For example, the signal generating section 10 generates a test signal whose phase, frequency and logic pattern are determined by a test program designated by a user or the like and inputs the generated test signal into the device under test 200.

The device under test 200 operates in accordance with the test signal input thereto and resultantly outputs a signal under measurement. The device under test 200 may be, for example, a memory device that outputs data read from an address designated by the test signal, or a logic device that causes a logic circuit to operate in accordance with the logic pattern of the test signal and outputs the result of the operation.

The transfer circuit 20 transfers the signal under measurement output from the device under test 200. The transfer circuit 20 includes a transmitter 30, a transfer path 22, and a receiver 70. The transmitter 30 transmits a transmission signal TR in accordance with the signal under measurement.

The transfer path 22 transfers the transmission signal TR transmitted from the transmitter 30 to the receiver 70. The transfer path 22 may be a wiring formed on a circuit board, a cable provided between apparatuses, or the like. The receiver 70 receives the transmission signal TR transferred via the transfer path 22.

The judging section 12 judges whether the device under test 200 is acceptable based on the signal under measurement transferred by the transfer circuit 20 (in this example, the transmission signal TR). The judging section 12 may judge whether the device under test 200 is acceptable by measuring the logic pattern of the transmission signal TR transferred by the transfer circuit 20 and examining whether the measured logic pattern of the transmission signal TR matches a predetermined expected value pattern. In the above-described manner, the test apparatus 100 tests the device under test 200.

Figure 2:
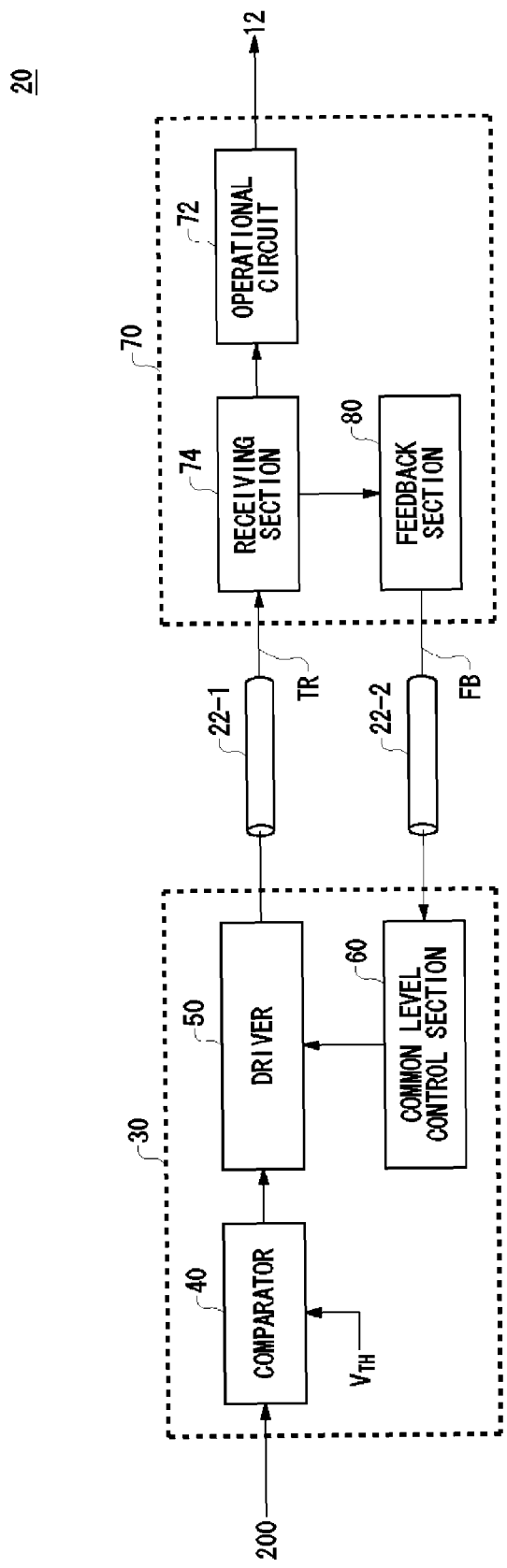
FIG. 2 illustrates exemplary configurations of a transmitter 30, a transfer path 22, and a receiver 70 of a transfer circuit 20.

FIG. 2 illustrates exemplary configurations of the transmitter 30, the transfer path 22, and the receiver 70 of the transfer circuit 20. The transmitter 30 controls the common level of the transmission signal TR to be output therefrom, in accordance with a feedback signal FB received from the receiver 70. According to the present example, the transmitter 30 includes a comparator 40, a driver 50, and a common level control section 60.

The comparator 40 receives the signal under measurement output from the device under test 200, compares the signal level of the signal under measurement with a predetermined threshold value and outputs the result of the comparison. For example, the comparator 40 outputs H logic during a period in which the signal level of the signal under measurement is higher than the threshold value and outputs L logic during a period in which the signal level of the signal under measurement is lower than or equal to the threshold value.

The driver 50 generates the transmission signal TR in accordance with the comparison result output from the comparator 40. For example, the driver 50 has a predetermined amplitude and a predetermined common level, and generates a transmission signal TR whose signal level transits in accordance with the logic value output from the comparator 40. The amplitude of the transmission signal TR output from the driver 50 may be set in advance by a user or the like. Here, the common level of the transmission signal TR output from the driver 50 is controlled by the common level control section 60.

The common level control section 60 controls the common level of the transmission signal TR to be output from the driver 50, in accordance with the feedback signal FB received from the receiver 70. The receiver 70 supplies to the transmitter 30 the feedback signal to control the common level of the transmission signal TR to be output from the transmitter 30.

The receiver 70 includes a receiving section 74, an operational circuit 72, and a feedback section 80. The receiving section 74 receives the transmission signal TR transferred via a transfer path 22-1. The operational circuit 72 receives the transmission signal TR via the receiving section 74 and operates in accordance with the transmission signal TR. For example, the operational circuit 72 may be a circuit designed to measure the transmission signal TR. More specifically, the operational circuit 72 may be a circuit designed to sample the transmission signal TR in accordance with a predetermined sampling clock to measure the logic pattern of the transmission signal TR, for example.

The feedback section 80 generates a feedback signal based on the common level of the transmission signal TR received by the receiving section 74 and transmits the generated feedback signal to the common level control section 60. The feedback signal is input into the common level control section 60 via a transfer path 22-2, which is different from the transfer path 22-1 for transferring the transmission signal TR.

For example, the feedback section 80 may detect the common level of the transmission signal TR received by the receiving section 74, and transmit to the common level control section 60 a feedback signal representing the difference between the detected common level and an expected common level. The common level control section 60 may control the common level of the transmission signal TR in such a manner as to reduce the difference represented by the feedback signal. In this way, the transmitter 30 can input into the receiving section 74 of the receiver 70 a transmission signal TR having a predetermined common level. Here, the feedback section 80 generates the feedback signal by following the variation in the common level of the transmission signal TR. Thus, the transfer circuit 20 can compensate for the variation in common level caused by the variation in temperature, power supply voltage and other parameters.

Figure 3:
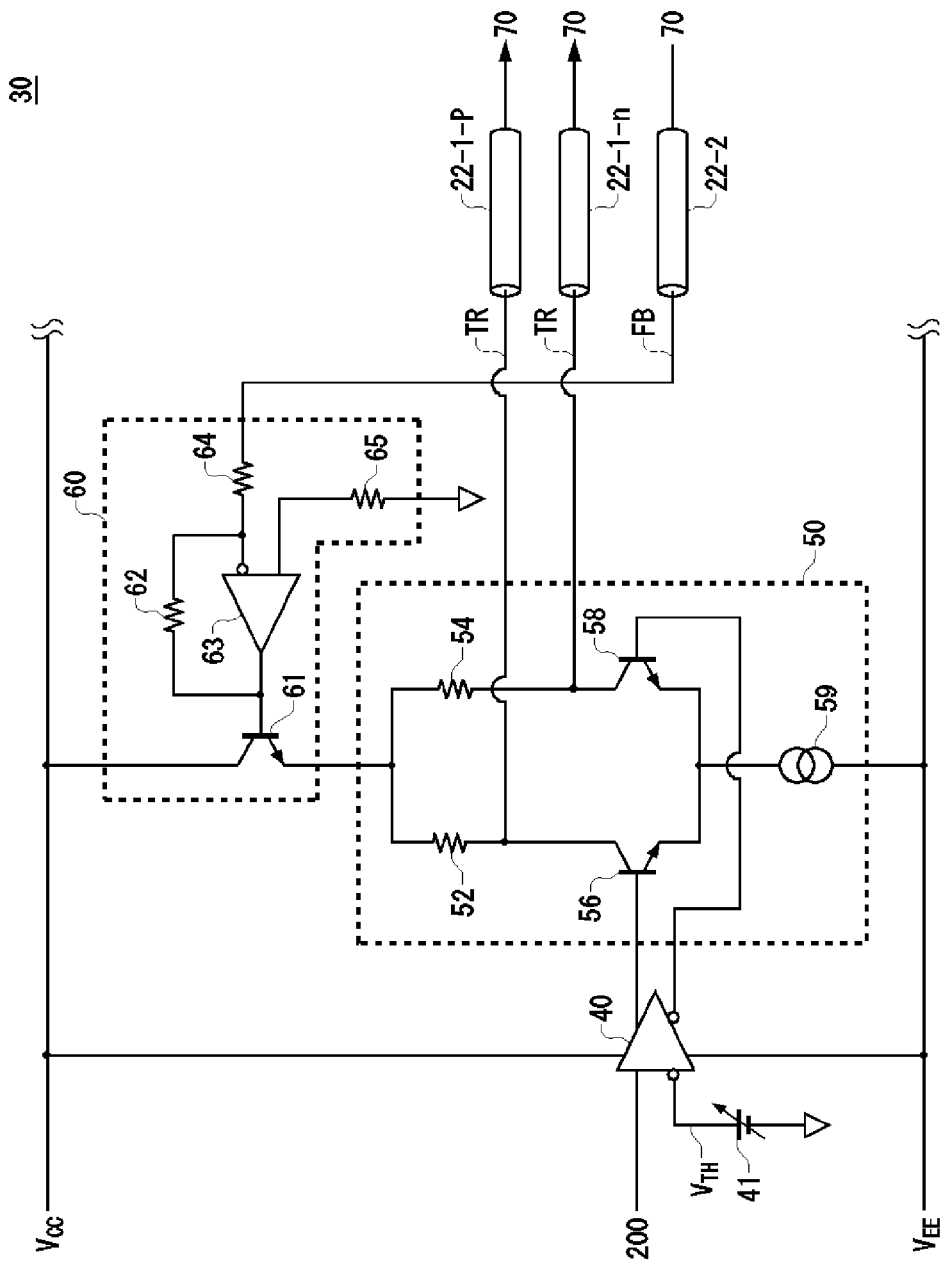
FIG. 3 illustrates an exemplary configuration of the transmitter 30 in detail.

FIG. 3 illustrates an exemplary configuration of the transmitter 30 in detail. According to the present example, the transmitter 30 includes a threshold value generating section 41 in addition to the constituents of the transmitter 30 shown in FIG. 2. The comparator 40 may be a differential circuit that receives the signal under measurement at the positive input terminal thereof, receives a threshold value VTH at the negative input terminal thereof, and outputs a voltage corresponding to the difference between the signal level of the signal under measurement and the threshold value VTH. The threshold value generating section 41 generates the threshold value VTH in accordance with designation from a user or the like and supplies the generated threshold value VTH to the comparator 40.

The driver 50 generates the transmission signal TR having a designated common level and a designated amplitude, based on the signal output from the comparator 40 and transmits the transmission signal TR. The driver 50 may be a current mode logic circuit that generates a differential transmission signal TR based on a differential signal output from the comparator 40. The driver 50 includes resistances 52 and 54, transistors 56 and 58, and a current source 59.

The transistors 56 and 58 are provided in parallel with each other with respect to the current source 59. The transistors 56 and 58 may be bipolar junction transistors. According to the present example, the transistors 56 and 58 are connected at the emitter terminal thereof to the current source 59. The current source 59 is provided between a negative power supply line VEE and the transistors 56 and 58. The base terminal of the transistor 56 is connected to the positive output of the comparator 40, and the base terminal of the transistor 58 is connected to the negative output of the comparator 40.

The resistance 52 is provided between the collector terminal of the transistor 56 and the positive power supply line VCC. The resistance 54 is provided between the collector terminal of the transistor 58 and the positive power supply line VCC. The collector voltage of the transistor 56 is input into the transfer path 22-1-p as the positive of the transmission signal TR, and the collector voltage of the transistor 58 is input into the transfer path 22-1-n as the negative of the transmission signal TR.

According to the present example, the common level control section 60 is provided between the driver 50 and the positive power supply line VCC, and controls the bias current flowing through the driver 50 in order to control the common level for the transmission signal TR. The common level control section 60 includes a transistor 61, resistances 62, 64 and 65, and a differential amplifier 63.

The transistor 61 is connected at the emitter terminal thereof to the resistances 52 and 54 and connected at the collector terminal thereof to the positive power supply line VCC. In this manner, the transistor 61 controls the bias current flowing through the driver 50 in accordance with the voltage supplied to the base terminal thereof.

The resistances 62, 64 and 65 and the differential amplifier 63 receive the feedback signal FB from the transfer path 22-2, amplify the received feedback signal FB with a designated amplification ratio, and apply the resultant feedback signal FB to the base terminal of the transistor 61. The amplification ratio can be set by controlling the characteristics of the resistances 62, 64 and 65.

According to the present example, the negative input terminal of the differential amplifier 63 receives the feedback signal FB via the resistance 64. On the other hand, the positive input terminal of the differential amplifier 63 is grounded via the resistance 65. The output terminal of the differential amplifier 63 is connected to the negative input terminal of the differential amplifier 63 via the resistance 62. The output terminal of the differential amplifier 63 is also connected to the base terminal of the transistor 61. Configured in the above-described manner, the common level control section 60 can control the common level of the transmission signal TR in accordance with the feedback signal.

Figure 4:
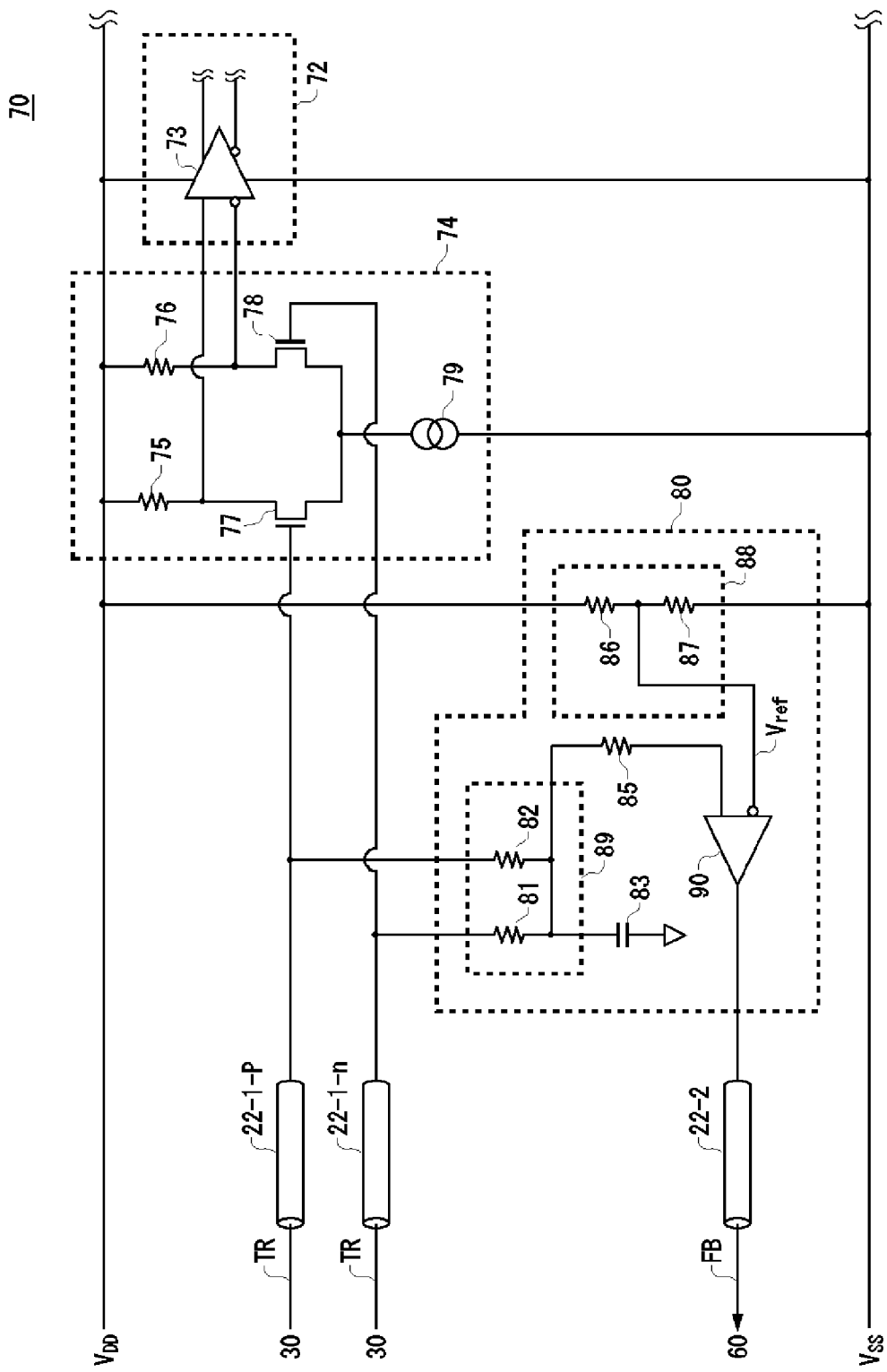
FIG. 4 illustrates an exemplary configuration of the receiver 70 in detail.

FIG. 4 illustrates an exemplary configuration of the receiver 70 in detail. According to the present example, the feedback section 80 includes a common level detecting section 89, a reference level generating section 88, a comparing section 90, a capacitor 83, and a resistance 85.

The common level detecting section 89 detects the common level of the transmission signal TR received by the receiver 70. According to the present example, the common level detecting section 89 includes resistances 81 and 82 that are provided in series between two differential-signaling wires connected to the transfer paths 22-1-p and 22-1-n that transfer the transmission signal TR in the differential signaling scheme. The common level detecting section 89 outputs, as the common level of the transmission signal TR, a resulting voltage divided by the resistances 81 and 82.

According to the present example, the resistances 81 and 82 have substantially the same resistance value. Stated differently, the common level of the differential transmission signal TR detected by the common level detecting section 89 is the voltage level at substantially the middle point between the differential-signaling wires in the present example. The capacitor 83 is provided between the ground potential and the connection point between the resistances 81 and 82. The capacitor 83 reduces sudden variation in the common level output from the common level detecting section 89.

The reference level generating section 88 generates a reference level Vref that is an expected level for the common level of the differential transmission signal input into the receiving section 74. According to the present example, the reference level generating section 88 includes reference voltage-dividing resistances 86 and 87 that are provided in series between the positive power supply line VDD and the negative power supply line VSS of the operational circuit 72. The reference level generating section 88 generates the reference level Vref by dividing the voltage applied to the receiving section 74 in accordance with the resistance ratio between the reference voltage-dividing resistances and inputs the generated reference level Vref into the negative input terminal of the comparing section 90.

The resistance 85 is provided between the common level detecting section 89 and the positive input terminal of the comparing section 90. The comparing section 90 receives the common level detected by the common level detecting section 89 via the resistance 85. Here, it is preferable that the resistance value of the resistance 85 is sufficiently higher than the resistance value of the resistances 81 and 82. When the input impedance of the comparing section 90 is sufficiently higher than the resistance value of the resistances 81 and 82, the common level may be directly input from the common level detecting section 89 into the comparing section 90 without the resistance 85.

The comparing section 90 compares the common level of the transmission signal TR detected by the common level detecting section 89 with the reference level Vref generated by the reference level generating section 88, and generates a feedback signal FB corresponding to the result of the comparison. According to the present example, the comparing section 90 generates, as the feedback signal FB, a direct current (DC) signal representing a result obtained by subtracting the reference level Vref from the common level of the transmission signal TR and inputs the DC signal into the common level control section 60.

Having the above-described configuration, the comparing section 90 generates the feedback signal FB that instructs the transmitter 30 to increase or decrease the common level of the transmission signal TR to be output from the transmitter 30, based on the result of comparing the common level of the transmission signal TR against the reference level Vref. Thus, the transmission signal TR input from the transmitter 30 into the receiving section 74 can have a common level corresponding to the predetermined reference level Vref.

The receiving section 74 receives the transmission signal TR in the differential signaling scheme from the transfer paths 22-1-$p$ and 22-1-$n$. The receiving section 74 may be a buffer that receives the transmission signal TR and inputs the received transmission signal TR into the operational circuit 72 of the following stage. The receiving section 74 includes resistances 75 and 76, transistors 77 and 78, and a current source 79.

The transistors 77 and 78 are provided in parallel with each other with respect to the current source 79. The transistors 77 and 78 may be CMOS transistors. According to the present example, the transistors 77 and 78 are respectively connected to the current source 79 at the source terminal and the drain terminal thereof. The current source 79 is provided between the negative power supply line VSS and the transistors 77 and 78. The transistor 77 receives at the gate terminal thereof the positive of the transmission signal TR via the transfer path 22-1-$p$, and the transistor 78 receives at the gate terminal thereof the negative of the transmission signal TR via the transfer path 22-1-$n$.

The resistance 75 is provided between the transistor 77 and the positive power supply line VDD. The resistance 76 is provided between the transistor 78 and the positive power supply line VSS. The respective voltages at the connection points between the transistors (77 and 78) and the resistances (75 and 76) are input into the operational circuit 72 as the differential transmission signal TR.

According to the present example, the transmission signal TR received by the receiving section 74 has a common level substantially equal to the reference level Vref. Therefore, it is possible to input a transmission signal TR that has a common level satisfying the input common-mode voltage of the receiving section 74 by setting the reference level Vref at an appropriate level. The resistance ratio between the reference voltage-dividing resistances 86 and 87 may be adjustable. The operational circuit 72 operates in accordance with the transmission signal TR input thereto from the receiving section 74. For example, the operational circuit 72 may include a buffer 73 that inputs the transmission signal TR into a logic circuit of the following stage.

Figure 5:
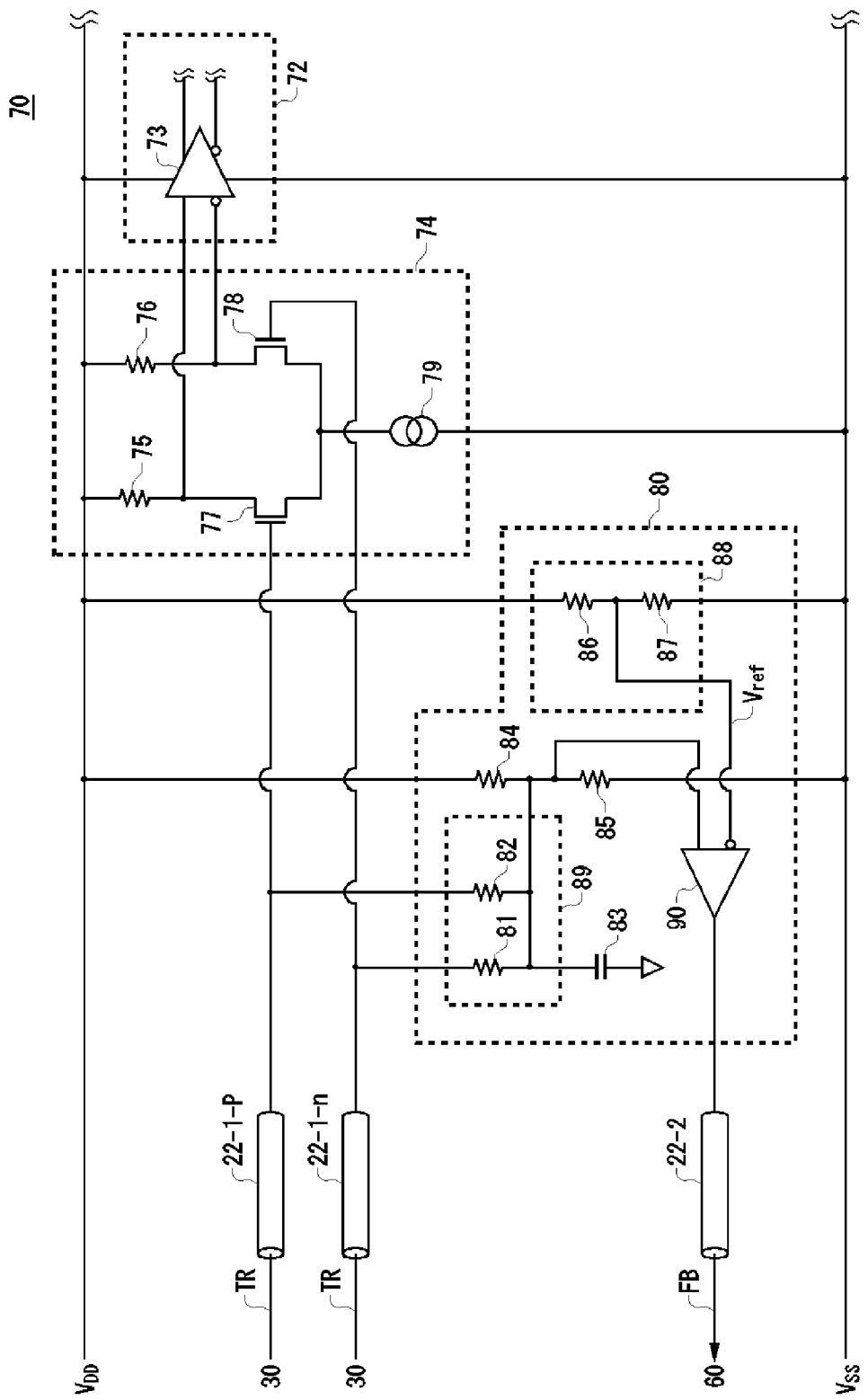
FIG. 5 illustrates another exemplary configuration of a feedback section 80 of the receiver 70.

FIG. 5 illustrates another exemplary configuration of the feedback section 80 of the receiver 70. According to the present example, the feedback section 80 includes a resistance 84 in addition to the constituents of the feedback section 80 shown in FIG. 4. The resistances 84 and 85 are provided in series between the positive power supply line VDD and the negative power supply line VSS. The resistance ratio between the resistances 84 and 85 may be substantially equal to the resistance ratio between the reference voltage-dividing resistances (86 and 87). The common level output from the common level detecting section 89 is applied to the connection point between the resistances 84 and 85, which is connected to the positive input terminal of the comparing section 90. The other constituents of the feedback section 80 relating to the present example may be the same as the corresponding constituents of the feedback section 80 having the configuration shown in FIG. 4. The above-described alternative configuration can also control the common level of the transmission signal TR input into the receiving section 74 to be substantially equal to the reference level Vref.

Figure 6:
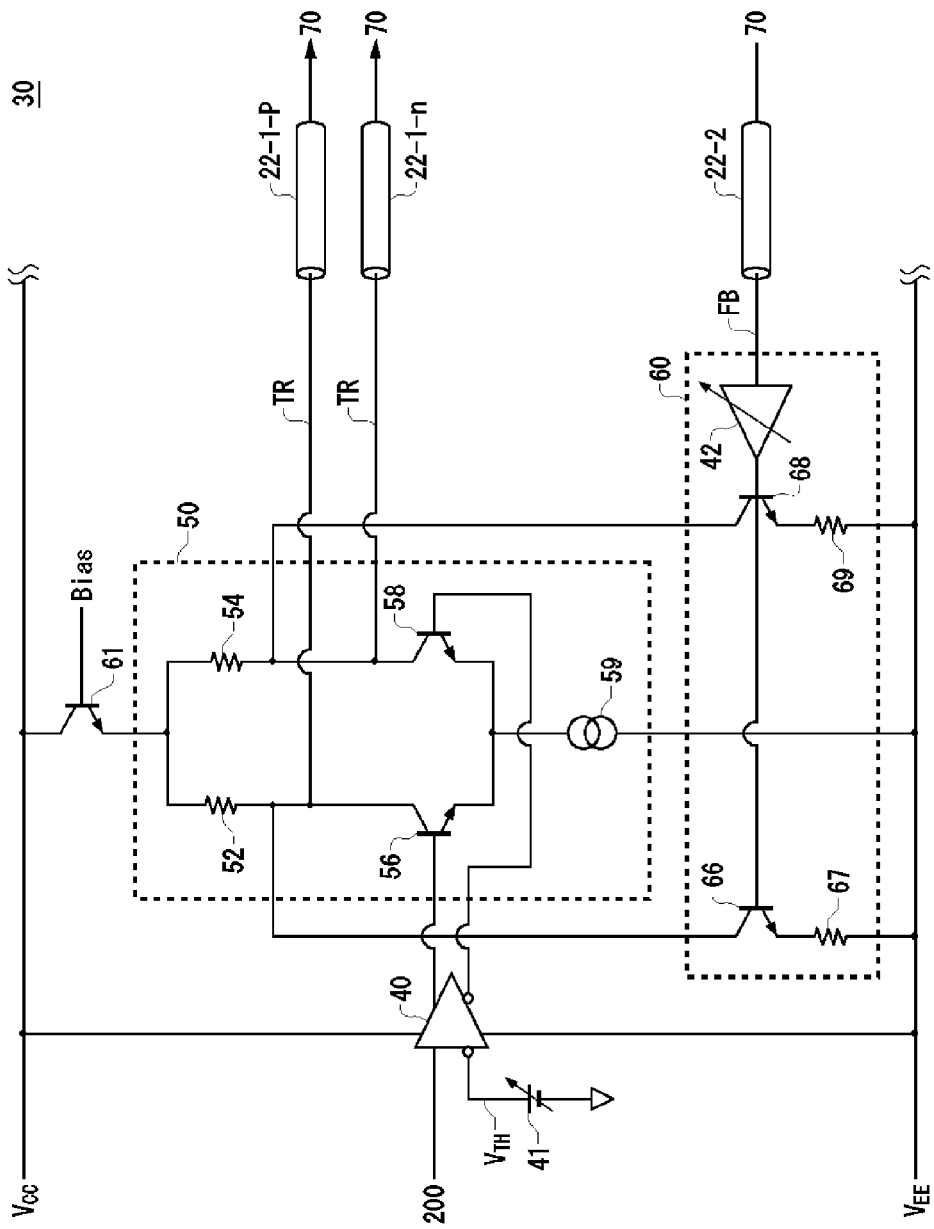
FIG. 6 illustrates another exemplary configuration of a common level control section 60 of the transmitter 30.

FIG. 6 illustrates another exemplary configuration of the common level control section 60 of the transmitter 30. According to the present example, the common level control section 60 is provided between the driver 50 and the negative power supply line VEE. Here, the transistor 61 is similarly provided between the driver 50 and the positive power supply line VCC in the present example and a predetermined bias voltage is applied to the base terminal of the transistor 61.

According to the present example, the common level control section 60 includes transistors 66 and 68, resistances 67 and 69, and an offset adjusting buffer 42. The transistor 66 is provided between the negative power supply line VEE and the connection point between the resistance 52 and the transistor 56, and provides a current in accordance with the feedback signal FB applied to the base terminal of the transistor 66. The resistance 67 is provided between the transistor 66 and the negative power supply line VEE. With the above-described configuration, the common level control section 60 controls the common level of the positive of the transmission signal TR in accordance with the feedback signal FB.

Similarly, the transistor 68 is provided between the negative power supply line VEE and the connection point between the resistance 54 and the transistor 58, and provides a current in accordance with the feedback signal FB applied to the base terminal of the transistor 68. The resistance 69 is provided between the transistor 68 and the negative power supply line VEE. With the above-described configuration, the common level control section 60 controls the common level of the negative of the transmission signal TR in accordance with the feedback signal FB. The transistor 66 and the resistance 67 preferably have substantially the same characteristics as the transistor 68 and the resistance 69.

The offset adjusting buffer 42 adds a designated offset to the feedback signal FB transferred by the transfer path 22-2 and applies the resulting feedback signal FB to the base terminals of the transistors 66 and 68. The offset added by the offset adjusting buffer 42 may be determined such that the transistors 66 and 68 are biased in a predetermined manner. The transmitter 30 having the configuration illustrated in FIG. 6 may be combined with the receiver 70 having any of the configurations described with reference to FIGS. 4 and 5.

Figure 7:
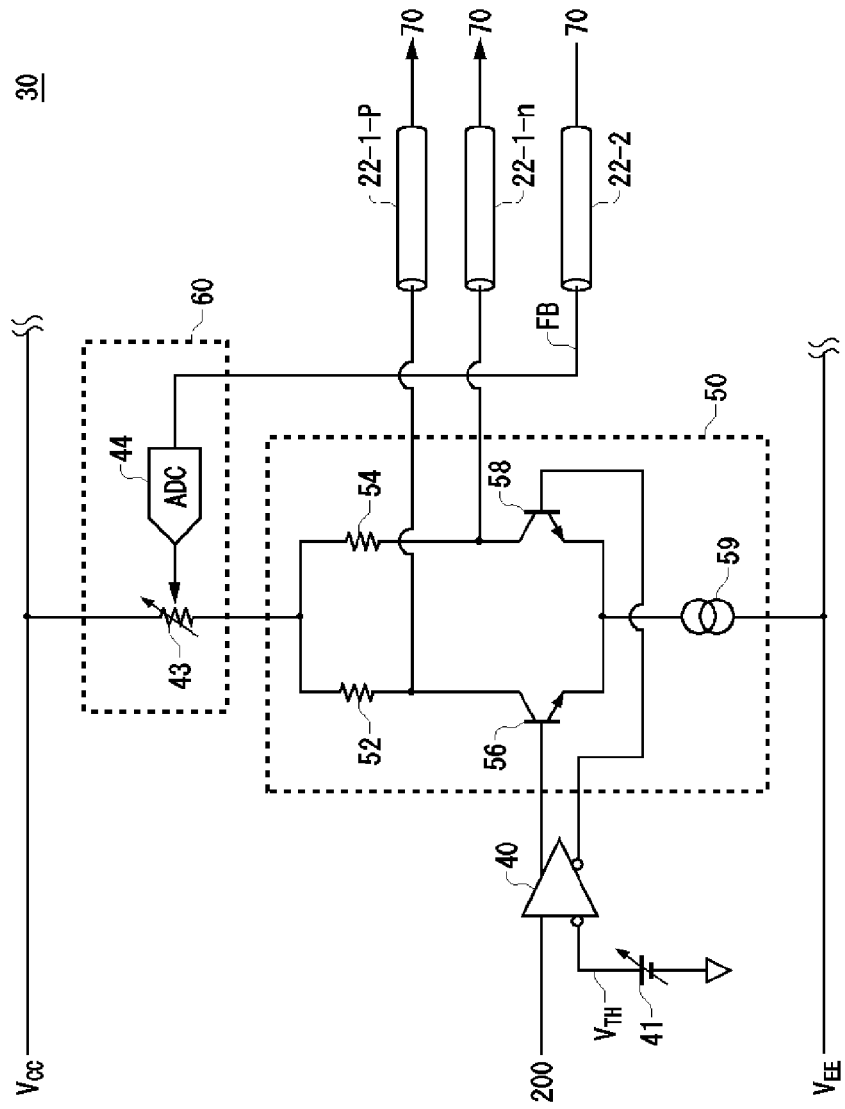
FIG. 7 illustrates another exemplary configuration of the common level control section 60 of the transmitter 30.

FIG. 7 illustrates another exemplary configuration of the common level control section 60 of the transmitter 30.

According to the present example, the common level control section 60 is provided between the driver 50 and the positive power supply line VEE. According to the present example, the common level control section 60 includes a variable resistance 43 and an analog digital converter (ADC) 44.

The variable resistance 43 is provided between the driver 50 and the positive power supply line VCC. The ADC 44 converts the feedback signal FB transferred by the transfer path 22-2 into a digital signal so as to control the resistance value of the variable resistance 43 to be in accordance with the digital value. With the above-described configuration, the common level control section 60 can also control the bias current flowing through the driver 50 in accordance with the feedback signal FB in order to adjust the common level of the transmission signal TR to be output from the driver 50. The transmitter 30 having the configuration illustrated in FIG. 7 may be combined with the receiver 70 having any of the configurations described with reference to FIGS. 4 and 5. When combined with the receiver 70 having the configuration described later with reference to FIG. 8, the common level control section 60 relating to the present example may not require the ADC 44.

Figure 8:
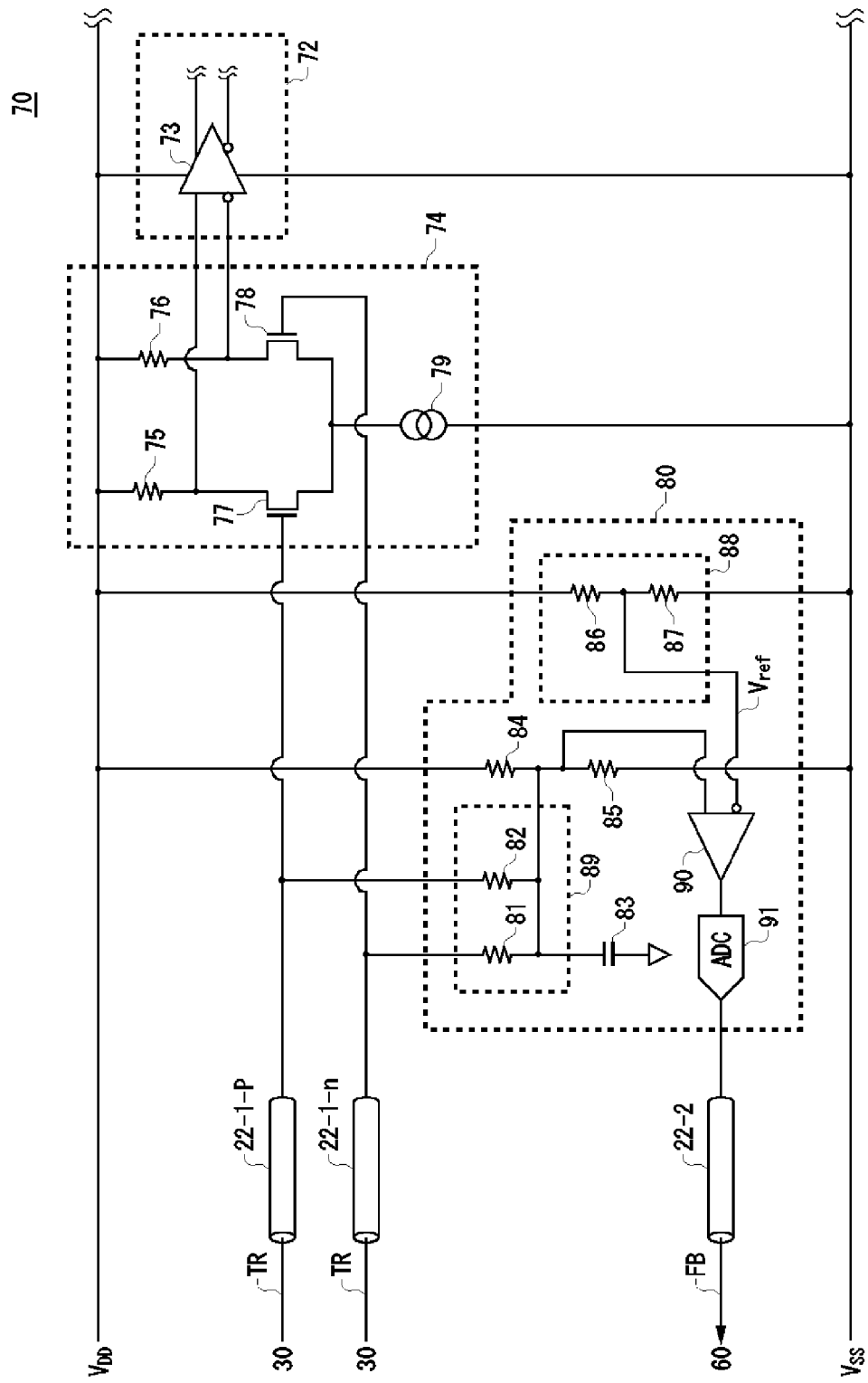
FIG. 8 illustrates another exemplary configuration of the feedback section 80 of the receiver 70.

FIG. 8 illustrates another exemplary configuration of the feedback section 80 of the receiver 70. According to the present example, the feedback section 80 includes an ADC 91 in addition to the constituents of the feedback section 80 described with reference to FIG. 4 or 5. FIG. 8 shows a case where the ADC 91 is added to the configuration of the feedback section 80 shown in FIG. 4.

The ADC 91 converts the feedback signal output from the comparing section 90 into a digital signal, and inputs the digital signal into the common level control section 60 via the transfer path 22-2. The above-described configuration can reduce the influences made by the transfer path 22-2 on the signal, such as transmission loss, thereby contributing to accurate control of the common level of the transmission signal TR.

Figure 9:
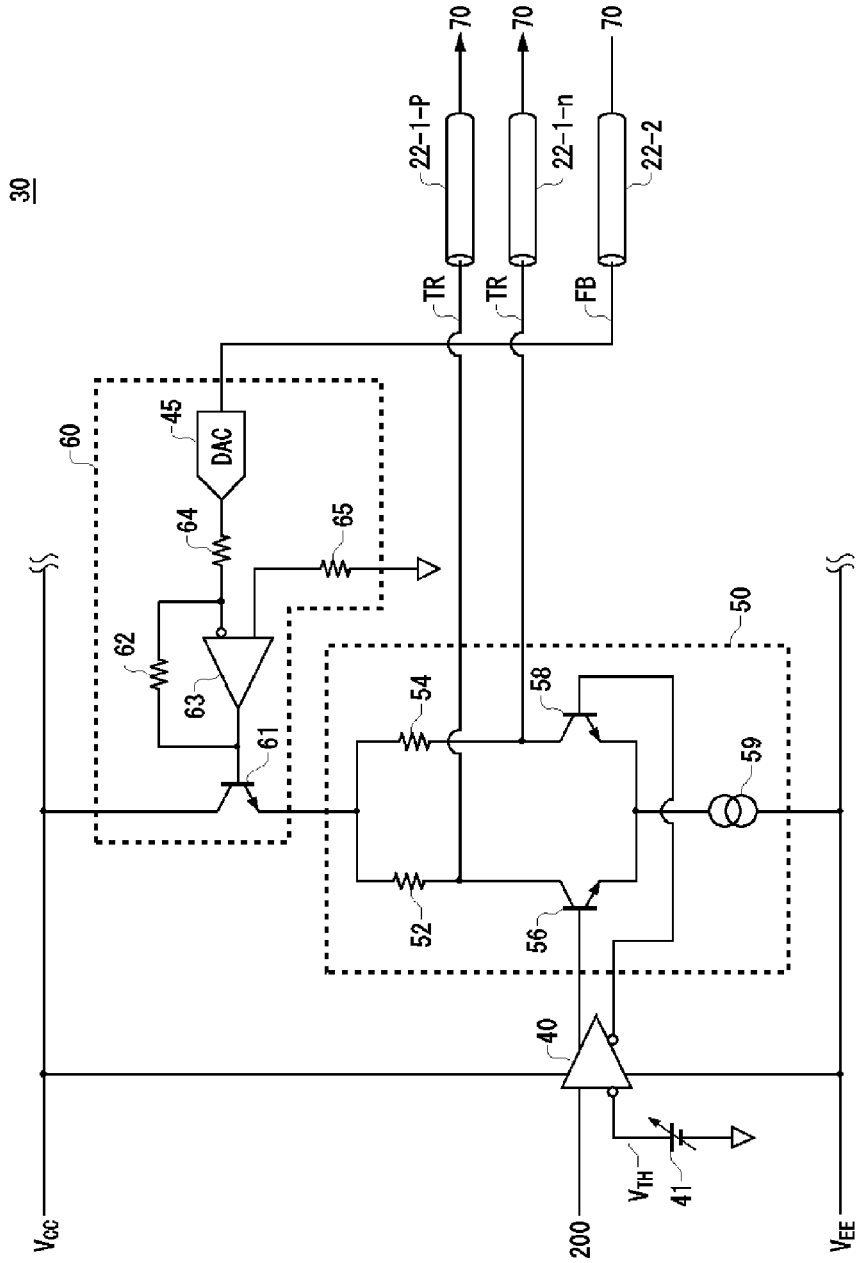
FIG. 9 illustrates another exemplary configuration of the common level control section 60 of the transmitter 30.

FIG. 9 illustrates another exemplary configuration of the common level control section 60 of the transmitter 30. According to the present example, the common level control section 60 includes a digital analog converter (DAC) 45 in addition to the constituents of the common level control section 60 described with reference to FIG. 3 or 6. FIG. 9 illustrates a case where the DAC 45 is added to the configuration of the common level control section 60 shown in FIG. 3. The transmitter 30 relating to the present example is combined with the receiver 70 having the configuration shown in FIG. 8.

The DAC 45 receives the digital feedback signal FB transferred by the transfer path 22-2 and converts the digital feedback signal FB into an analog signal. The DAC 45 also inputs the resulting analog signal into the resistance 64 shown in FIG. 3 or the transistors 66 and 68 shown in FIG. 6. The above-described configuration can reduce the influences made by the transfer path 22-2 on the signal such as transmission loss, thereby contributing to accurate control of the common level of the transmission signal TR.

Figure 10:
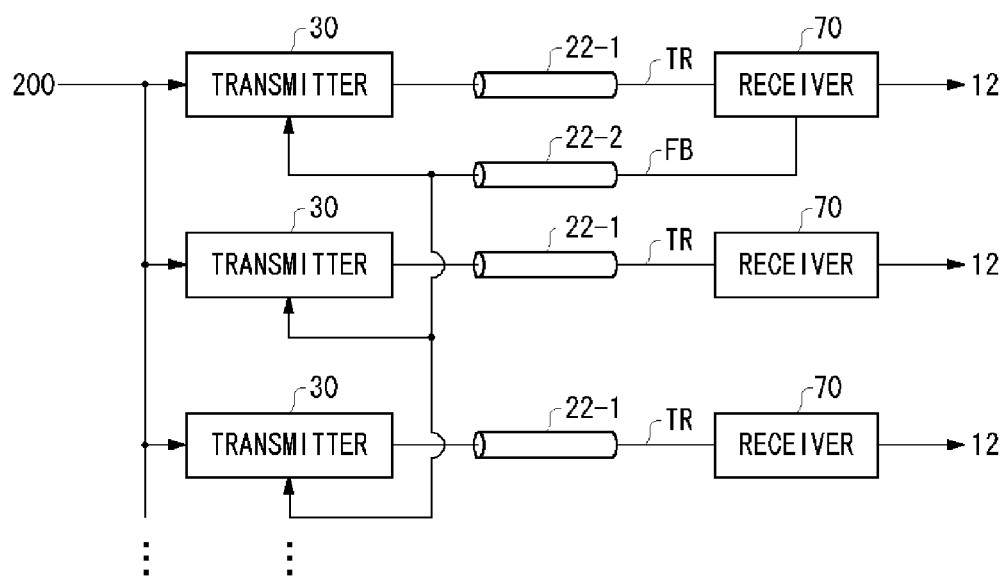
FIG. 10 illustrates another exemplary configuration of the transfer circuit 20.

FIG. 10 illustrates another exemplary configuration of the transfer circuit 20. According to the present example, the transfer circuit 20 includes a plurality of sets of the transmitter 30, the transfer path 22-1 and the receiver 70. Thus, the transfer circuit 20 relating to the present example transfers a plurality of transmission signals TR in parallel. The respective sets of the transmitter 30, the transfer path 22-1 and the receiver 70 may have substantially the same characteristics.

The individual transmitters 30 receive the feedback signal FB from one of the receivers 70 via a common transfer path 22-2. Here, the remaining receivers 70 that are not configured to output the feedback signal FB may not include the feedback section 80. The transfer circuit 20 relating to the present example can adjust the common level for a plurality of transmission signals TR with a simple configuration.

Although some aspects of the present invention have been described by way of exemplary embodiments, it should be understood that those skilled in the art might make many changes and substitutions without departing from the spirit and the scope of the present invention which is defined only by the appended claims.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

What is claimed is:

1. A transfer circuit comprising:
a transmitter that outputs a transmission signal; and
a receiver that receives the transmission signal, wherein
the receiver supplies to the transmitter a feedback signal for controlling a common level of the transmission signal output from the transmitter,
the transmitter controls the common level of the transmission signal output therefrom, in accordance with the feedback signal received from the receiver,
the receiver includes:
a receiving section that operates in accordance with the transmission signal;
a reference level generating section that generates a reference level representing an expected level for the common level of the transmission signal input into the receiving section;
a comparing section that compares the common level of the transmission signal input into the receiving section against the reference level and generates the feedback signal in accordance with a result of the comparison, and
the reference level generating section includes a set of reference voltage-dividing resistances that are provided between a positive power supply line and a negative power supply line of the receiving section and generate the reference level by dividing a power supply voltage of the receiving section.

2. The transfer circuit as set forth in claim 1, wherein the comparing section detects the common level of the transmission signal and generates, as the feedback signal, a direct current signal in accordance with the detected common level.

3. The transfer circuit as set forth in claim 1, wherein the receiver further includes
an analog digital converter that converts the feedback signal generated by the comparing section into a digital signal.

4. The transfer circuit as set forth in claim 1, wherein the comparing section generates the feedback signal, in accordance with the result of the comparison, that instructs the transmitter to increase or decrease the common level of the transmission signal output from the transmitter.

5. The transfer circuit as set forth in claim 1, wherein the transmitter outputs a differential signal to the receiver, and the reference level generating section generates the reference level representing an expected level for the common level of the differential signal input into the receiving section.

6. The transfer circuit as set forth in claim 1, wherein
the transmitter outputs a differential signal to the receiver,
the reference level generating section generates the reference level representing an expected level for the common level of the differential signal input into the receiving section, and
the receiver further includes
a common level detecting section that is provided between differential-signaling wires that input the differential signal into the receiving section and detects, as the common level of the differential signal, a voltage level at a substantially middle point between the differential-signaling wires.

7. A test apparatus for testing a device under test, comprising:
a signal generating section that generates a test signal;
a transfer circuit that transfers a signal under measurement output from the device under test in response to the test signal; and
a judging section that judges whether the device under test is acceptable, based on the signal under measurement transferred by the transfer circuit, wherein
the transfer circuit is as set forth in claim 1, and includes:
a transmitter that receives the signal under measurement from the device under test and outputs the signal under measurement; and
a receiver that receives the signal under measurement from the transmitter and inputs the signal under measurement into the judging section.

8. The test apparatus as set forth in claim 7, wherein
the transmitter is one of a plurality of transmitters that each output a transmission signal,
the receiver supplies the feedback signal to each of the plurality of transmitters via a common transfer path,
each of the plurality of transmitters controls the common level of the transmission signal output therefrom, in accordance with the feedback signal received from the receiver, and
the receiver is one of a plurality of receivers that each receive a transmission signal.

9. The test apparatus as set forth in claim 8, wherein
the plurality of transmitters output the transmission signals in parallel, and the plurality of receivers receive the transmission signals in parallel.

10. The transfer circuit as set forth in claim 1, wherein
the transmitter comprises:
an analog digital converter that converts the feedback signal received from the receiver into a digital signal used to adjust the common level of the transmission signal.

11. The transfer circuit as set forth in claim 10, further comprising:
a variable resistance whose resistance value is adjusted in accordance with a value of the digital signal.

12. The transfer circuit as set forth in claim 1, wherein
the transmitter comprises:
a digital analog converter that receives the feedback signal and converts the feedback signal into an analog signal, and
the transmitter controls the common level of the transmission signal output therefrom, in accordance with the analog signal.

13. The transfer circuit as set forth in claim 1, wherein
the transmitter is one of a plurality of transmitters that each output a transmission signal,
the receiver supplies the feedback signal to each of the plurality of transmitters via a common transfer path,
each of the plurality of transmitters controls the common level of the transmission signal output therefrom, in accordance with the feedback signal received from the receiver, and
the receiver is one of a plurality of receivers that each receive a transmission signal.

14. The transfer circuit as set forth in claim 13, wherein
the plurality of transmitters output the transmission signals in parallel, and the plurality of receivers receive the transmission signals in parallel.

15. A receiver for use in a transfer circuit that transfers a transmission signal, the receiver configured to supply, to a transmitter in the transfer circuit, a feedback signal used to control a common level of the transmission signal output from the transmitter, the receiver comprising:
a receiving section that operates in accordance with the transmission signal;
a reference level generating section that generates a reference level representing an expected level for the common level of the transmission signal input into the receiving section; and
a comparing section that compares the common level of the transmission signal input into the receiving section against the reference level and generates the feedback signal in accordance with a result of the comparison, wherein
the reference level generating section includes a set of reference voltage-dividing resistances that are provided between a positive power supply line and a negative power supply line of the receiving section and generate the reference level by dividing a power supply voltage of the receiving section.

16. The receiver as set forth in claim 15, wherein
the comparing section detects the common level of the transmission signal and generates, as the feedback signal, a direct current signal in accordance with the detected common level.

17. The receiver as set forth in claim 15, further comprising:
an analog digital converter that converts the feedback signal generated by the comparing section into a digital signal.

18. The receiver as set forth in claim 15, wherein
the comparing section generates the feedback signal, in accordance with the result of the comparison, that instructs the transmitter to increase or decrease the common level of the transmission signal output from the transmitter.

19. The receiver as set forth in claim 15, wherein
the transmission signal is a differential signal, and
the reference level generating section generates the reference level representing an expected level for the common level of the differential signal input into the receiving section.

* * * * *